(12) United States Patent
Guzie et al.

(10) Patent No.: US 10,529,881 B2
(45) Date of Patent: Jan. 7, 2020

(54) INTERCONNECT MEMBER

(71) Applicant: SolAero Technologies Corp., Albuquerque, NM (US)

(72) Inventors: Brian Guzie, Rio Rancho, NM (US); Colton Fascitelli, Albuquerque, NM (US); Benjamin Heintz, Albuquerque, NM (US); Anthony Sandoval, Albuquerque, NM (US); Benjamin Cho, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 0 days.

(21) Appl. No.: 15/909,053

(22) Filed: Mar. 1, 2018

(65) Prior Publication Data

US 2019/0273172 A1 Sep. 5, 2019

(51) Int. Cl.
| | |
|---|---|
| *H01L 31/05* | (2014.01) |
| *H01L 27/142* | (2014.01) |
| *H01L 31/0693* | (2012.01) |
| *H01L 31/0735* | (2012.01) |
| *H01L 31/0725* | (2012.01) |
| *H01L 31/0687* | (2012.01) |

(52) U.S. Cl.
CPC ...... *H01L 31/0508* (2013.01); *H01L 27/1421* (2013.01); *H01L 31/0512* (2013.01); *H01L 31/0687* (2013.01); *H01L 31/0693* (2013.01); *H01L 31/0725* (2013.01); *H01L 31/0735* (2013.01)

(58) Field of Classification Search
CPC ......... H01L 31/022425; H01L 31/0687; H01L 31/0508; H01L 31/0512; H01L 31/0693; H01L 31/0725; H01L 31/0735
See application file for complete search history.

(56) References Cited

U.S. PATENT DOCUMENTS

| | | | | |
|---|---|---|---|---|
| 3,454,774 A | | 7/1969 | Wizenick | |
| 3,459,597 A | * | 8/1969 | Baron | ................. H01L 31/0508 136/244 |
| 3,993,505 A | * | 11/1976 | Pack, Sr. | ............. H01L 31/0508 136/244 |
| 4,525,594 A | * | 6/1985 | Pschunder | ........ H01L 31/02008 136/244 |

(Continued)

FOREIGN PATENT DOCUMENTS

| | | |
|---|---|---|
| EP | 3128559 A1 | 2/2017 |
| JP | 2002-343994 A | 11/2002 |
| KR | 2010-0135515 A | 12/2010 |

OTHER PUBLICATIONS

European Search Report for EP Patent Application No. 16154931.6, dated Dec. 14, 2016, 8 pages.

(Continued)

*Primary Examiner* — Golam Mowla

(57) ABSTRACT

The disclosure relates to a metallic interconnect member for connecting a first solar cell to a second solar cell. The interconnect member includes one or more serpentine paths having substantially perpendicular loops. The interconnect member may include two connection pads for connecting to the first solar cell. A further connection pad for connecting to a bypass diode may be included. The disclosure further relates to a string of solar cells including a first and a second solar cell connected by an interconnect member.

11 Claims, 9 Drawing Sheets

(56) References Cited

U.S. PATENT DOCUMENTS

| | | | | |
|---|---|---|---|---|
| 4,832,755 | A * | 5/1989 | Barton | H01L 31/048 |
| | | | | 136/251 |
| 5,330,583 | A * | 7/1994 | Asai | H01L 31/048 |
| | | | | 136/244 |
| 5,430,616 | A * | 7/1995 | Katsu | H01L 31/0508 |
| | | | | 174/126.4 |
| 5,821,609 | A * | 10/1998 | DiStefano | H01L 21/4846 |
| | | | | 257/669 |
| 6,034,322 | A | 5/2000 | Pollard | |
| 6,278,054 | B1 | 8/2001 | Ho et al. | |
| 6,315,575 | B1 * | 11/2001 | Kajimoto | H01L 31/188 |
| | | | | 136/256 |
| 6,359,209 | B1 | 3/2002 | Glenn et al. | |
| 7,732,705 | B2 | 6/2010 | Stan et al. | |
| D665,338 | S | 8/2012 | Tourino | |
| D665,339 | S | 8/2012 | Tourino | |
| 8,440,907 | B2 * | 5/2013 | Kurahashi | H01L 31/022433 |
| | | | | 136/252 |
| 8,574,008 | B2 * | 11/2013 | Große | H01M 2/202 |
| | | | | 439/627 |
| 8,802,479 | B2 | 8/2014 | Pearce et al. | |
| 9,102,422 | B2 | 8/2015 | Tourino | |
| 9,153,720 | B1 * | 10/2015 | Frost | H01L 31/0508 |
| 9,153,721 | B1 | 10/2015 | Tourino | |
| D777,099 | S | 1/2017 | Yang | |
| D777,659 | S | 1/2017 | Tourino et al. | |
| D777,660 | S | 1/2017 | Tourino et al. | |
| D780,110 | S | 2/2017 | Yang | |
| D816,602 | S | 5/2018 | Tourino et al. | |
| D816,603 | S | 5/2018 | Tourino et al. | |
| 9,966,487 | B2 * | 5/2018 | Magnusdottir | H01L 31/0201 |
| 10,217,885 | B2 * | 2/2019 | Inaba | H01L 31/049 |
| 2004/0261834 | A1 * | 12/2004 | Basore | H01L 31/022425 |
| | | | | 136/244 |
| 2007/0079863 | A1 * | 4/2007 | Stan | H01L 31/022425 |
| | | | | 136/244 |
| 2009/0159116 | A1 * | 6/2009 | Umetani | H01L 31/0508 |
| | | | | 136/251 |
| 2009/0277491 | A1 * | 11/2009 | Nakamura | H01L 31/022433 |
| | | | | 136/244 |
| 2010/0018562 | A1 * | 1/2010 | Kurahashi | H01L 31/022433 |
| | | | | 136/244 |
| 2011/0067746 | A1 * | 3/2011 | Okubo | H01L 27/1421 |
| | | | | 136/244 |
| 2011/0240337 | A1 * | 10/2011 | Montello | H01L 31/0508 |
| | | | | 174/126.1 |
| 2012/0031457 | A1 * | 2/2012 | Taira | H01L 31/0508 |
| | | | | 136/244 |
| 2012/0080069 | A1 * | 4/2012 | Ishiguro | H01L 31/0508 |
| | | | | 136/244 |
| 2012/0234388 | A1 | 9/2012 | Stancel et al. | |
| 2014/0124014 | A1 | 5/2014 | Morad et al. | |
| 2015/0263183 | A1 * | 9/2015 | Zimmermann | H01L 31/0201 |
| | | | | 136/244 |
| 2017/0012576 | A1 * | 1/2017 | Inaba | H02S 40/34 |
| 2017/0040479 | A1 | 2/2017 | Tourino et al. | |
| 2017/0200836 | A1 * | 7/2017 | Toya | H01L 31/0508 |

OTHER PUBLICATIONS

Search Report and Opinion dated Oct. 10, 2018 for European Patent Application No. 18165799.0, 6 pages.

* cited by examiner

INTERCONNECT MEMBER

The present disclosure relates to the field of solar cell semiconductor devices, and more particularly relates to interconnect members for electrically connecting a first solar cell to a second solar cell.

BACKGROUND

Solar power from solar cells has been predominantly provided by silicon semiconductor technology. In the past several years, however, high-volume manufacturing of III-V compound semiconductor multijunction solar cells for space applications has accelerated the development of such technology. Compared to silicon, III-V compound semiconductor multijunction devices have greater energy conversion efficiencies and generally more radiation resistance, although they tend to be more complex to properly specify and manufacture. Typical commercial III-V compound semiconductor multijunction solar cells have energy efficiencies that exceed 29.5% under one sun, air mass 0 (AM0) illumination, whereas even the most efficient silicon technologies generally reach only about 18% efficiency under comparable conditions. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

Typical III-V compound semiconductor solar cells are fabricated on a semiconductor wafer in vertical, multijunction structures or stacked sequence of solar subcells, each subcell formed with appropriate semiconductor layers and including a p-n photoactive junction. Each subcell is designed to convert photons over different spectral or wavelength bands to electrical current after the sunlight impinges on the front of the solar cell, and photons pass through the subcells, with each subcell being designed for photons in a specific wavelength band. After passing through a subcell, the photons that are not absorbed and converted to electrical energy propagate to the next subcells, where such photons are intended to be captured and converted to electrical energy.

The individual solar cells or wafers are then disposed in horizontal arrays, with the individual solar cells connected together in an electrical series and/or parallel circuit. The shape and structure of an array, as well as the number of cells it contains, are determined in part by the desired output voltage and current needed by the payload or subcomponents of the payload, the amount of electrical storage capacity (batteries) on the spacecraft, and the power demands of the payloads during different orbital configurations.

A solar cell designed for use in a space vehicle (such as a satellite, space station, or an interplanetary mission vehicle), may have a sequence of subcells with compositions and band gaps which have been optimized to achieve maximum energy conversion efficiency for the AM0 solar spectrum in space. The AM0 solar spectrum in space is notably different from the AM1.5 solar spectrum at the surface of the earth, and accordingly terrestrial solar cells are designed with subcell band gaps optimized for the AM1.5 solar spectrum.

There are substantially more rigorous qualification and acceptance testing protocols used in the manufacture of space solar cells to ensure that space solar cells can operate satisfactorily at the wide range of temperatures and temperature cycles encountered in space. These testing protocols include (i) high-temperature thermal vacuum bake-out; (ii) thermal cycling in vacuum (TVAC) or ambient pressure nitrogen atmosphere (APTC); and in some applications (iii) exposure to radiation equivalent to that which would be experienced in the space mission, and measuring the current and voltage produced by the cell and deriving cell performance data.

As used in this disclosure and claims, the term "space-qualified" shall mean that the electronic component (i.e., the solar cell) provides satisfactory operation under the high temperature and thermal cycling test protocols. The exemplary conditions for vacuum bake-out testing include exposure to a temperature of +100° C. to +135° C. (e.g., about +100° C., +110° C., +120° C., +125° C., +135° C.) for 2 hours to 24 hours, 48 hours, 72 hours, or 96 hours; and exemplary conditions for TVAC and/or APTC testing that include cycling between temperature extremes of −180° C. (e.g., about −180° C., −175° C., −170° C., −165° C., −150° C., −140° C., −128° C., −110° C., −100° C., −75° C., or −70° C.) to +145° C. (e.g., about +70° C., +80° C., +90° C., +100° C., +110° C., +120° C., +130° C., +135° C., or +145° C.) for 600 to 32,000 cycles (e.g., about 600, 700, 1500, 2000, 4000, 5000, 7500, 22000, 25000, or 32000 cycles), and in some space missions up to +180° C. See, for example, Fatemi et al., "*Qualification and Production of Emcore ZTJ Solar Panels for Space Missions*," Photovoltaic Specialists Conference (PVSC), 2013 IEEE 39th (DOI: 10.1109/PVSC 2013 6745052). Such rigorous testing and qualifications are not generally applicable to terrestrial solar cells and solar cell arrays.

The space solar cells and arrays experience a variety of complex environments in space missions, including the vastly different illumination levels and temperatures seen during normal earth orbiting missions, as well as even more challenging environments for deep space missions, operating at different distances from the sun, such as at 0.7, 1.0 and 3.0 AU (AU meaning astronomical units), or in other words, distances from the sun of respectively 104.7 million km, 149.6 million km and 448.8 million km respectively. The photovoltaic arrays also endure anomalous events from space environmental conditions, and unforeseen environmental interactions during exploration missions. Hence, electron and proton radiation exposure, collisions with space debris, and/or normal aging in the photovoltaic array and other systems could cause suboptimal operating conditions that degrade the overall power system performance, and may result in failures of one or more solar cells or array strings and consequent loss of power.

A further distinctive difference between space solar cell arrays and terrestrial solar cell arrays is that a space solar cell array utilizes welding to provide robust electrical interconnections between the solar cells, while terrestrial solar cell arrays typically utilize solder for electrical interconnections. Welding is required in space solar cell arrays to provide the very robust electrical connections that can withstand the wide temperature ranges and temperature cycles encountered in space such as from −175° C. to +180° C. In contrast, solder joints are typically sufficient to survive the rather narrow temperature ranges (e.g., about −40° C. to about +50° C.) encountered with terrestrial solar cell arrays.

A further distinctive difference between space solar cell arrays and terrestrial solar cell arrays is that a space solar cell array may utilize silver-plated metal material for interconnection members, while terrestrial solar cells typically utilize copper wire for interconnects. Useful metals include, for example, molybdenum; a nickel-cobalt ferrous alloy material designed to be compatible with the thermal expansion characteristics of borosilicate glass such as that available under the trade designation KOVAR from Carpenter Technology Corporation; a nickel iron alloy material having a uniquely low coefficient of thermal expansion available under the trade designation Invar, FeNi36, or 64FeNi; or the like.

A further distinctive difference of a space solar cell from a terrestrial solar cell is that the space solar cell normally includes a cover glass over the semiconductor device to provide radiation resistant shielding from particles in the space environment which could damage the semiconductor material. The cover glass is typically a ceria doped borosilicate glass which is typically from three to six mils (0.0762 to 0.1524 mm) in thickness and attached by a transparent adhesive to the solar cell.

Yet a further specific requisite for space applications relates to deployability of the solar cell array.

In summary, there are significant differences in design, materials, and configurations between a space-qualified III-V compound semiconductor solar cell and subassemblies and arrays of such solar cells, on the one hand, and silicon solar cells or other photovoltaic devices used in terrestrial applications, on the other hand. These differences are so substantial that prior teachings associated with silicon or other terrestrial photovoltaic system are simply unsuitable and have no applicability to the design configuration of space-qualified solar cells and arrays. Indeed, the design and configuration of components adapted for terrestrial use with its modest temperature ranges and cycle times often teach away from the highly demanding design requirements for space-qualified solar cells and arrays and their associated components.

The assembly of individual solar cells together with electrical interconnects and the cover glass form a so-called "CIC" (Cell-Interconnected-Cover glass) assembly, which are then typically electrically connected to form an array of series-connected solar cells. The solar cells used in many arrays often have a substantial size; for example, in the case of the single standard substantially "square" solar cell trimmed from a 100 mm wafer with cropped corners, the solar cell can have a side length of seven cm or more.

Bypass diodes are frequently used in solar cell arrays comprising a plurality of series connected solar cells or groups of solar cells. When all of the solar cells in an array are receiving sunlight or are illuminated, each solar cell will be forward biased. However, if any of the solar cells are not illuminated, because of shadowing or damage, those cells may become reversed biased in order to carry the current generated by the illuminated cells. This reverse biasing can degrade the cells and can ultimately render the cells inoperable. In order to prevent reverse biasing, a bypass diode is often connected in parallel with the solar cell.

The purpose of the bypass diode is to draw the current away from the shadowed or damaged cell. Since the bypass diode is in parallel with the solar cell, the current flows through the bypass diode and it becomes forward biased when the shadowed cell becomes reverse biased. Rather than forcing current through the shadowed cell, which would occur in the absence of a bypass diode, the diode draws the current away from the shadowed cell and maintains the series electrical connection to the next cell.

Bypass diodes may be used for each of the cells in a solar cell string or solar cell array. In alternative examples, a single bypass diode may be used for a string of solar cells. Such a bypass diode may be arranged at an end of the string.

Different types of bypass diodes have been utilized in prior art. One conventional method to provide bypass diode protection to a solar cell array has been to connect a bypass diode between adjacent cells, with the anode of the bypass diode connected to one solar cell and the cathode of the diode connected to an adjoining solar cell. However, this technique is complicated to manufacture and requires a very difficult and inefficient assembly method. Another technique for providing a bypass diode for each cell involves a recess next to each solar cell and a bypass diode being placed into this recess and connected in parallel with the solar cell to which it is attached.

Solar cells are often produced from circular or substantially circular wafers. For example, solar cells for space applications are typically multi-junction solar cells grown on substantially circular wafers. These circular wafers are sometimes 100 mm or 150 mm diameter wafers. However, as explained above, for assembly into a solar array (henceforth, also referred to as a solar cell panel), the circular wafers are often divided into other form factors to make solar cells. One preferable form factor for a solar cell for space is a rectangle, such as a square, which allows for the area of a rectangular panel consisting of an array of solar cells to be filled 100%, assuming that there is no space between the adjacent rectangular solar cells.

Placing the bypass diodes at the cropped corners of the solar cells can be an efficient solution as it makes use of a space that is not used for converting solar energy into electrical energy. As a solar cell array or solar panel often includes a large number of solar cells, and often a correspondingly large number of bypass diodes, the efficient use of the area at the cropped corners of individual solar cells adds up and can represent an important enhancement of the efficient use of space in the overall solar cell assembly.

As noted above, individual solar cells are connected sequentially to form a vertical column of an array. Such series connection requires an electrical path between the cathode or top layer of one cell with the anode or bottom layer of the adjacent cell. In particular, in solar cells with an integral bypass diode, a connection usually must be made from both the (multijunction) solar cell and from the bypass diode on the top surface of a first wafer to the bottom surface of the adjoining wafer.

Prior art interconnection arrangements have utilized a single electrical contact to the top layer (or anode) of the bypass diode. Although such an arrangement is generally satisfactory for most applications and reliability requirements, there are certain applications in which more stringent reliability is required. Further known interconnection members between solar cells include serpentine paths in order to increase flexibility.

Solar cell arrays for space applications are designed to last for a long period of time, e.g. 10 or 15 or 20 years. Continuous thermal loading throughout the life time of the solar cell array can lead to cracks in the interconnect members. An example of a prior art interconnection member is shown in FIG. 9. The interconnect member of FIG. 9 includes two connections pads 10A, 10B on a first side for connecting to a cathode of a first solar cell, whereas there are two areas 20A, 20B on the opposite side connected to an anode of a second solar cell. The first and second solar cell may be separated along a first direction 4 and the interconnect member bridges the distance between them. There are two curved serpentine paths 11, 12 in between the connection pads on the first side and the connection portions on the other. Both serpentine paths include a number of parallel portions extending along the transverse direction 6, i.e.

perpendicular to the longitudinal direction and these parallel portions are connected by curved portions. The prior art interconnect members were found to be sensitive to cracking or separation, particularly under shear loads. Cracking was found to occur mainly in the curved portions of the serpentine paths.

It is an object of the present disclosure to provide interconnect members with improved reliability. It is a further object to provide interconnect members that are capable of enduring continuous thermal loading in space applications.

SUMMARY

In a first aspect, the present disclosure provides a metallic interconnect member having a first side for connecting to a first solar cell, and a second side for connecting to a second solar cell, the first and second solar cells being spaced apart along a first axis. The interconnect member further has one or more serpentine paths extending from the first side to the second side, wherein each of the serpentine paths has at least one longitudinal loop, and at least one transverse loop. The longitudinal loop comprises two parallel longitudinal portions extending along the first axis, and a curved portion between the two parallel longitudinal portions, and the transverse loop comprises two parallel transverse portions extending along a second axis, substantially perpendicular to the first axis, and a curved portion between the two parallel transverse portions.

The serpentine paths that extend from one side to the other that include loops in the length and in the width direction of the interconnect member, increased flexibility is achieved, particularly under (thermal) shear loading.

In a further aspect, the present disclosure provides a string of solar cells comprising a first solar cell and a second solar cell connected in series, an interconnect member comprising a first and a second cathode pad to connect to a cathode of the first solar cell and a first and a second anode pad to connect to an anode of the second solar cell. The interconnect member comprises a first serpentine path connecting the first cathode pad with the first anode pad, and a second serpentine path connecting the second cathode pad with the second anode pad. The first serpentine path includes a longitudinal loop having two parallel longitudinal portions and a curved portion in between, and a transverse loop having two parallel transverse portions and a curved portion in between, the longitudinal loop being substantially perpendicular to the transverse loop.

In yet a further aspect, the present disclosure provides a metallic interconnect member having a first side for connecting to a first solar cell, and a second side for connecting to a second solar cell, the first and second solar cells being spaced apart along a first axis. The metallic interconnect member further includes at least one serpentine path extending from the first side to the second side in a plane, and a step portion out of the plane and the serpentine path comprises a first obround section providing flexibility in a first direction in the plane, and a second obround section providing flexibility in a second direction in the plane, and perpendicular to the first direction.

BRIEF DESCRIPTION OF THE DRAWINGS

Non-limiting examples of the present disclosure will be described in the following, with reference to the appended drawings, in which.

DETAILED DESCRIPTION OF EXAMPLES

Figure 1:
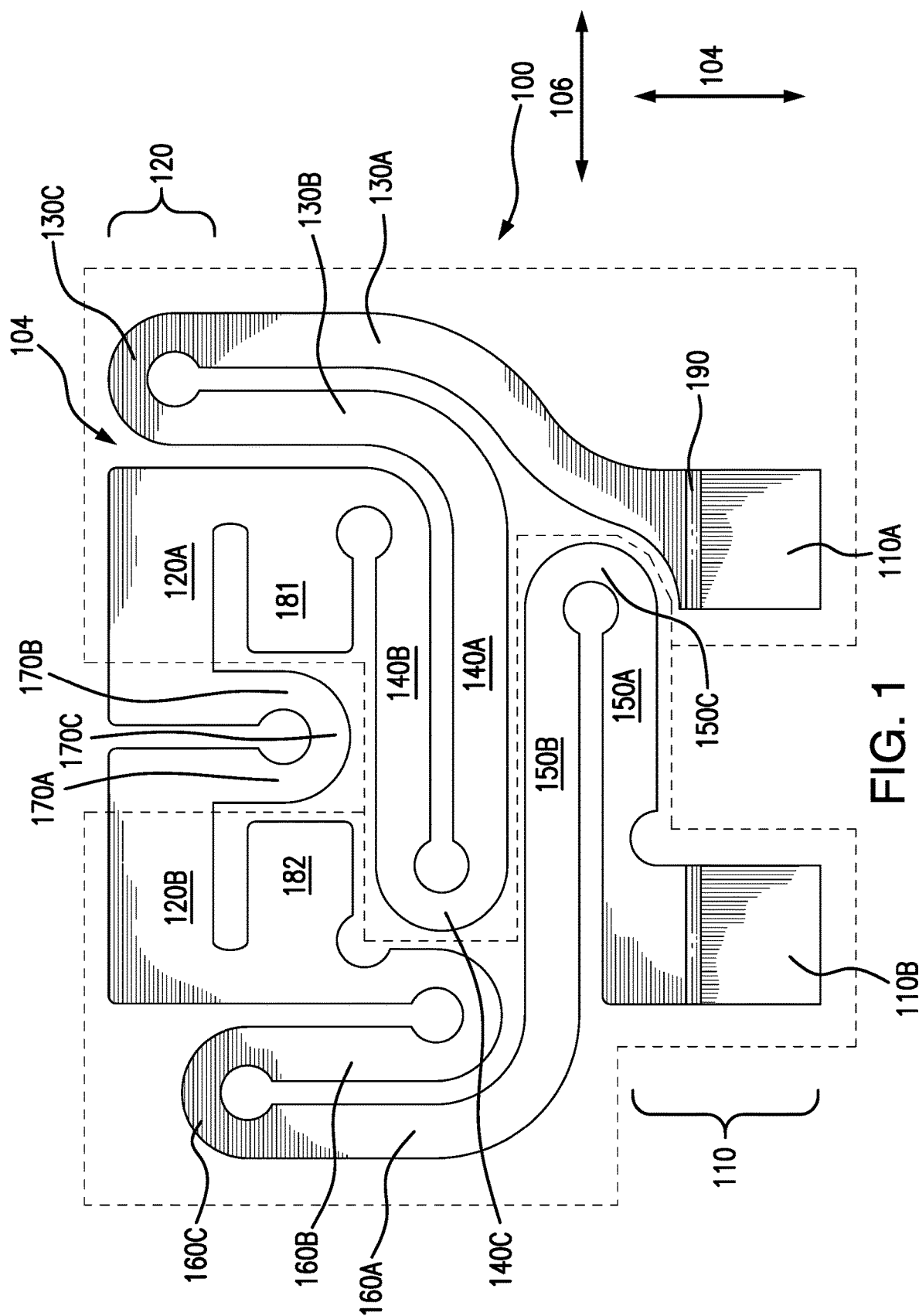
FIG. 1 discloses a top view of a first example of an interconnect member.

With reference to FIGS. 1-4, a first example of an interconnect member will now be described in more detail. Also, a string of solar cells incorporating such an interconnect member will now be described.

FIGS. 1-4 show an interconnect member 100 for connecting a first solar 101 to a second solar cell 102. The interconnect member 100 may be connected to a cathode of the first solar cell, and an anode of the second solar cell. The first solar cell may be separated from the second solar cell along first longitudinal direction 104. A second direction 106 is defined as perpendicular to the first longitudinal direction 104, in a top view. The interconnect member may connect a top surface of first solar cell 101 with a bottom surface of second solar cell 102.

A top side of the solar cell shall herein be defined as a side of the solar cell that is irradiated by the sun. A bottom side of the solar cell is not irradiated by the sub. Typically, the cathode of a solar cell will be at a top side, whereas the anode of a solar cell will usually be on a bottom side.

The interconnect member 100 in this example comprises a first connection pad 110A and a second connection pad 110B at a first side 110. The interconnect member 100 also includes a first connection portion 120A and a second connection portion 120B for connecting to the second solar cell on a second side 120 of the interconnect member.

In this example, the first connection pad 110A is connected with the first connection portion 120A through a first serpentine path, schematically indicated in interrupted lines on the right hand side of the top view. Similarly, a second serpentine path extends from second connection pad 110B to second connection portion 120B, schematically indicated in interrupted lines on the left hand side of the top view.

In this example, both the first serpentine path, and the second serpentine path include a longitudinal loop 130, 160, and a transverse loop 140 and 150. Although both serpentine paths only include a single transverse loop and a single longitudinal loop it should be clear that in other examples multiple loops could be included in either one of the serpentine paths.

Each of the loops has a shape corresponding to a section of a partial obround, in other words a section of a stadium shape. The longitudinal loops 130 and 160 include a first i.e. a longitudinal portion 130A, 160A, a second longitudinal portion 130A, 160A (parallel to the first) and a curved portion 130C, 160C in between these two portions. Transverse loops 140, 150 include a first transverse portion 140A, 150A, extending along second (transverse) direction 106, a second transverse portion 140B, 150B, parallel to the first portion and a curved portion 140C, 150C in between.

The serpentine paths including loops that are substantially perpendicular to each other introduce sufficient flexibility to withstand shear and normal loads by increasing the flexibility in various directions. The longitudinal loops introduce flexibility particularly in the transverse direction 106 and vertical direction (perpendicular to the plane of FIG. 1) by a gap in between the longitudinal parallel portions. Similarly, the transverse loops increase flexibility in the longitudinal direction and in the vertical direction.

Since one side (e.g. top surface) of the first solar cell is connected to a bottom of the second solar cell, a vertical step 190 may be included relatively close to the connection pads 110A, 110B. In this particular example, only the connection pads 110A, 110B are in a first substantially horizontal plane, whereas the remainder of the interconnect member including serpentine paths are in a second substantially horizontal plane. In this example, the first horizontal plane is arranged on top of the solar cells, whereas the second horizontal plane is arranged at the bottom of the solar cells.

One or more of the curved portions of the loops of the interconnect member may have an inner wall between the two parallel portions of the loop forming a substantially circular segment. The local width of the serpentine path in the curved portion is reduced as compared to the parallel portions. The resulting half "dog bone" or half "dumbbell" structure has been found to reduce stress concentrations in the curved portion of the loops. Without wishing to be bound to any theory, it is believed that the cracks in the prior art interconnect member were at least partly caused by stress concentrations in the curved portions. It has been found, that by locally reducing the width or in spite of locally reducing the width, high stress can be avoided in the curved portions.

In the particular example of FIGS. 1-4, further flexibility is introduced in the interconnect member by land portions 181, 182, i.e. by further gaps in between the lands 181, 182 and the connection portions 120A and 120B. In this particular example also, a further longitudinal loop 170 having parallel portions 170A and 170B and curved portion 170C is included in between the two connection portions 120A and 120B.

Starting from connection pad 110A, the first serpentine path first includes longitudinal loop which is transversally displaced with respect to connection pad 110A and connection portion 120A. In the top view of this example, the longitudinal loop is displaced to the right side. The serpentine path then includes a transverse loop 140. The second serpentine path extending between second connection pad 110B and second connection portion 120B on the other hand first has a transverse loop, and then a longitudinal loop transversally displaced with respect to second connection pad 110B and second connection portion 120B. The longitudinal loop of this serpentine path is displaced to the opposite lateral side, i.e. in the top view of this example it is displaced to the left. Thanks to this design, the transverse loops 140, 150 fit in between the connection pads 110A and 110B on the first side 110 and the connection portions 120A and 120B on the second side. A compact design may thus be achieved.

Figure 2:
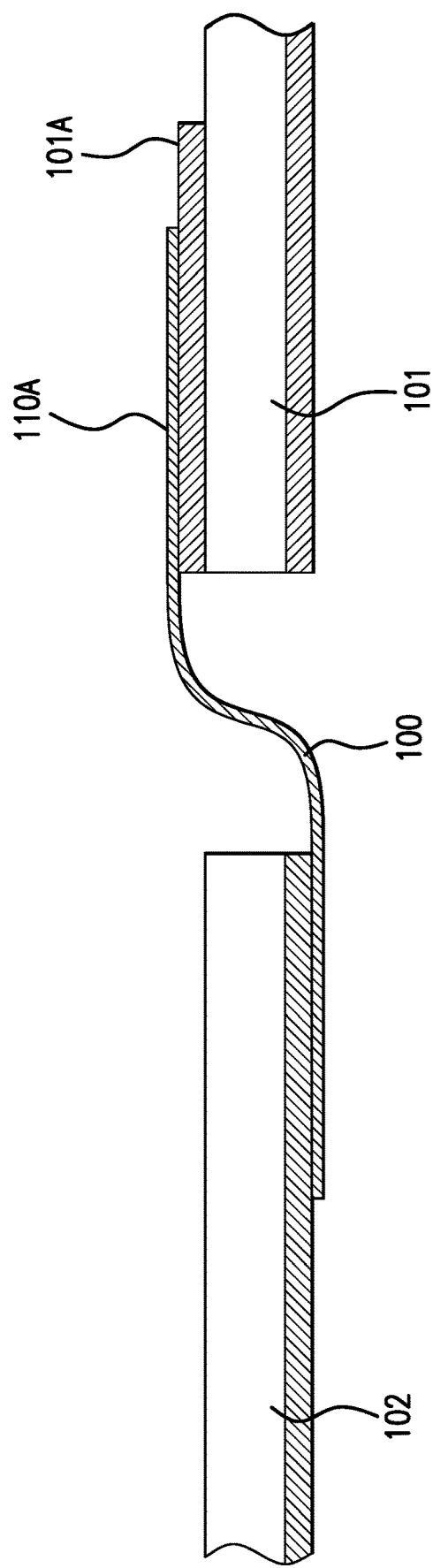
FIG. 2 discloses a side view of the interconnect member shown in FIG. 1.
Figure 3:
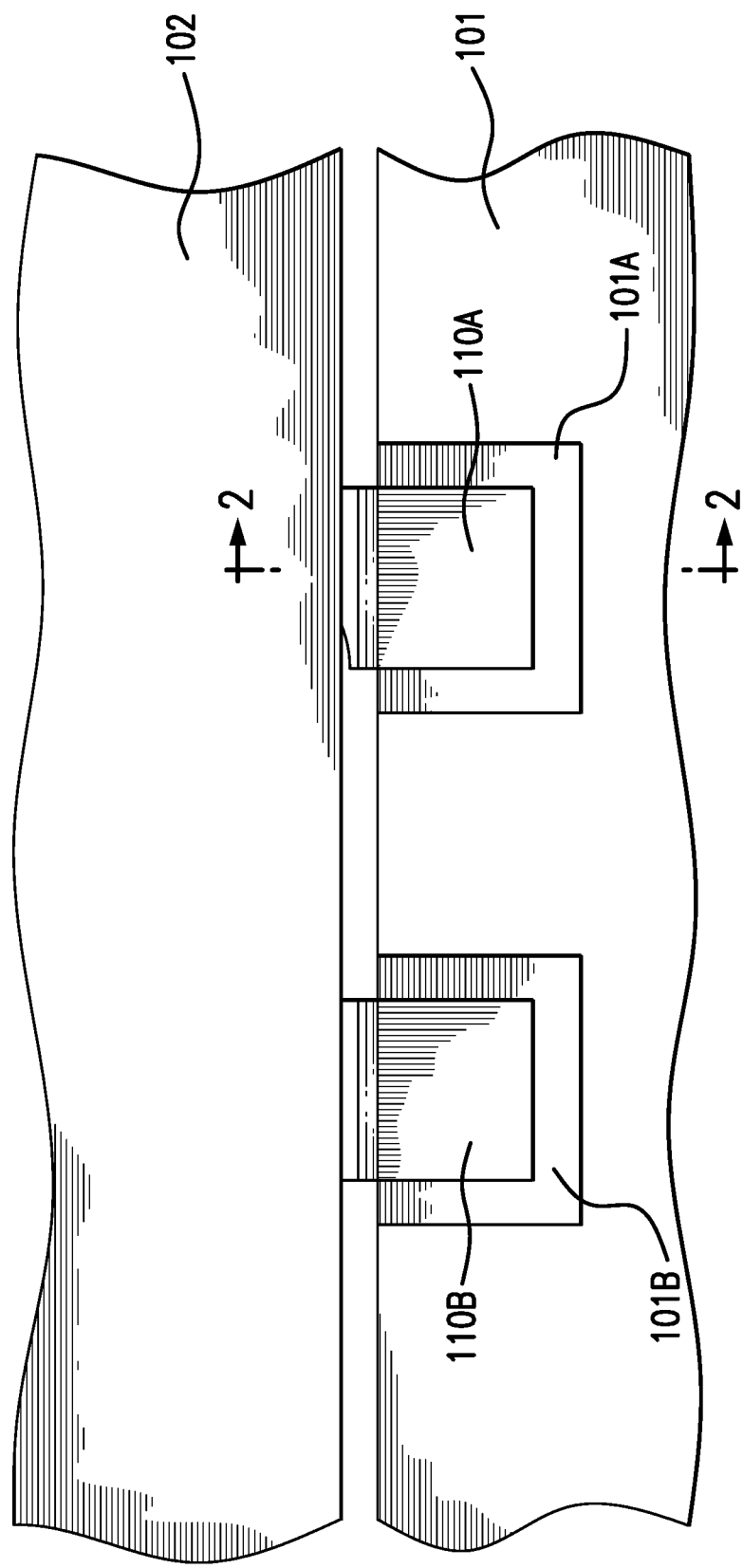
FIG. 3 discloses a top view of the first example of an interconnect member in assembly with two solar cells.

FIG. 2 illustrates a side view of an assembly of a first solar cell 101 and a second solar cell 102 with interconnect member 100 connecting both. FIG. 3 illustrates how the first connection pad 110A and the second connection pad 110B connect respectively to a first and a second cathode portion 101A and 101B of the first solar cell 101. The cross-sectional side view of FIG. 2 is indicated in FIG. 3. The solar cells may be covered by a protective glass cover.

Figure 4:
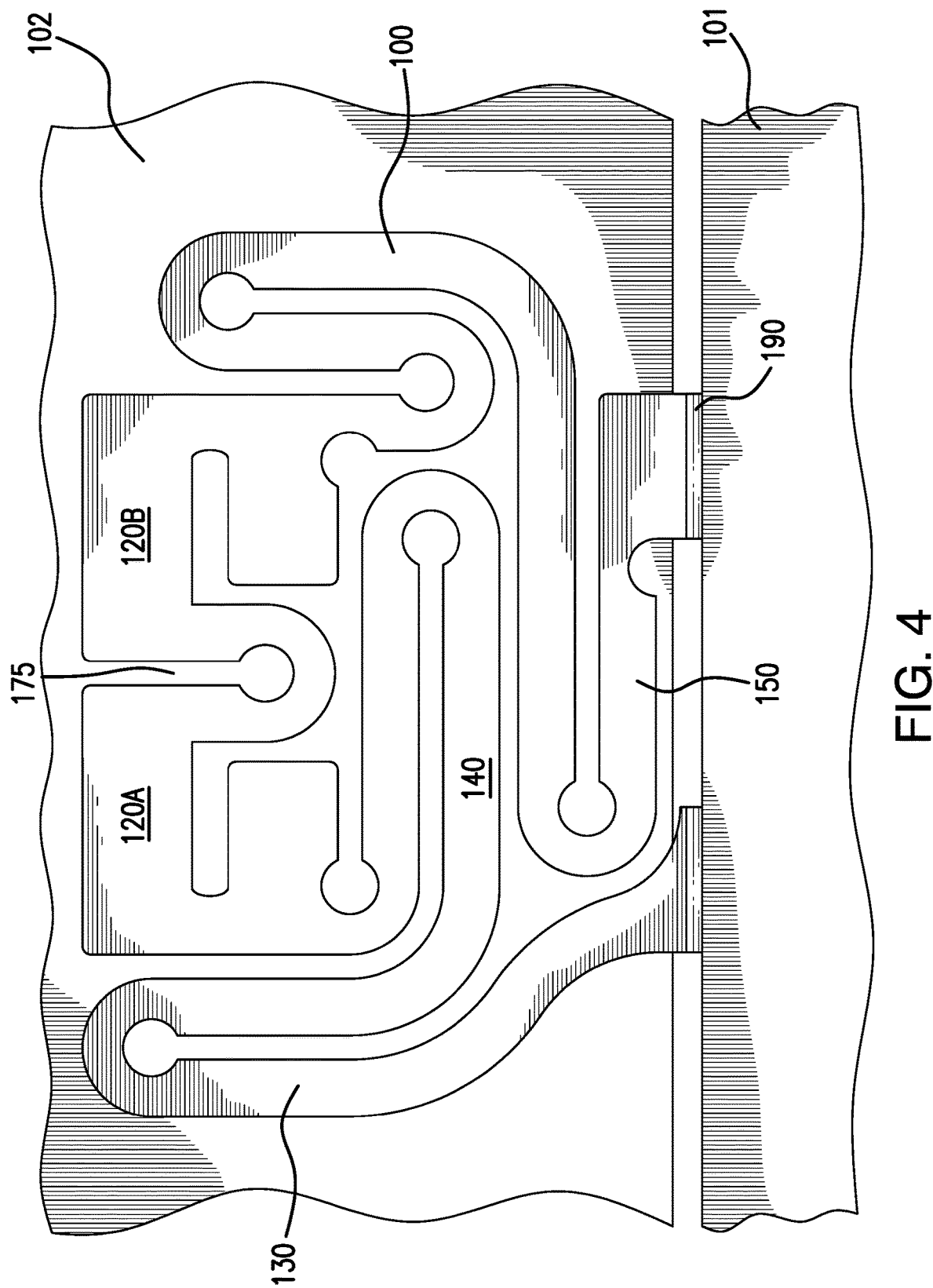
FIG. 4 discloses a bottom view of the first example of an interconnect member in assembly with two solar cells.
Figure 5:
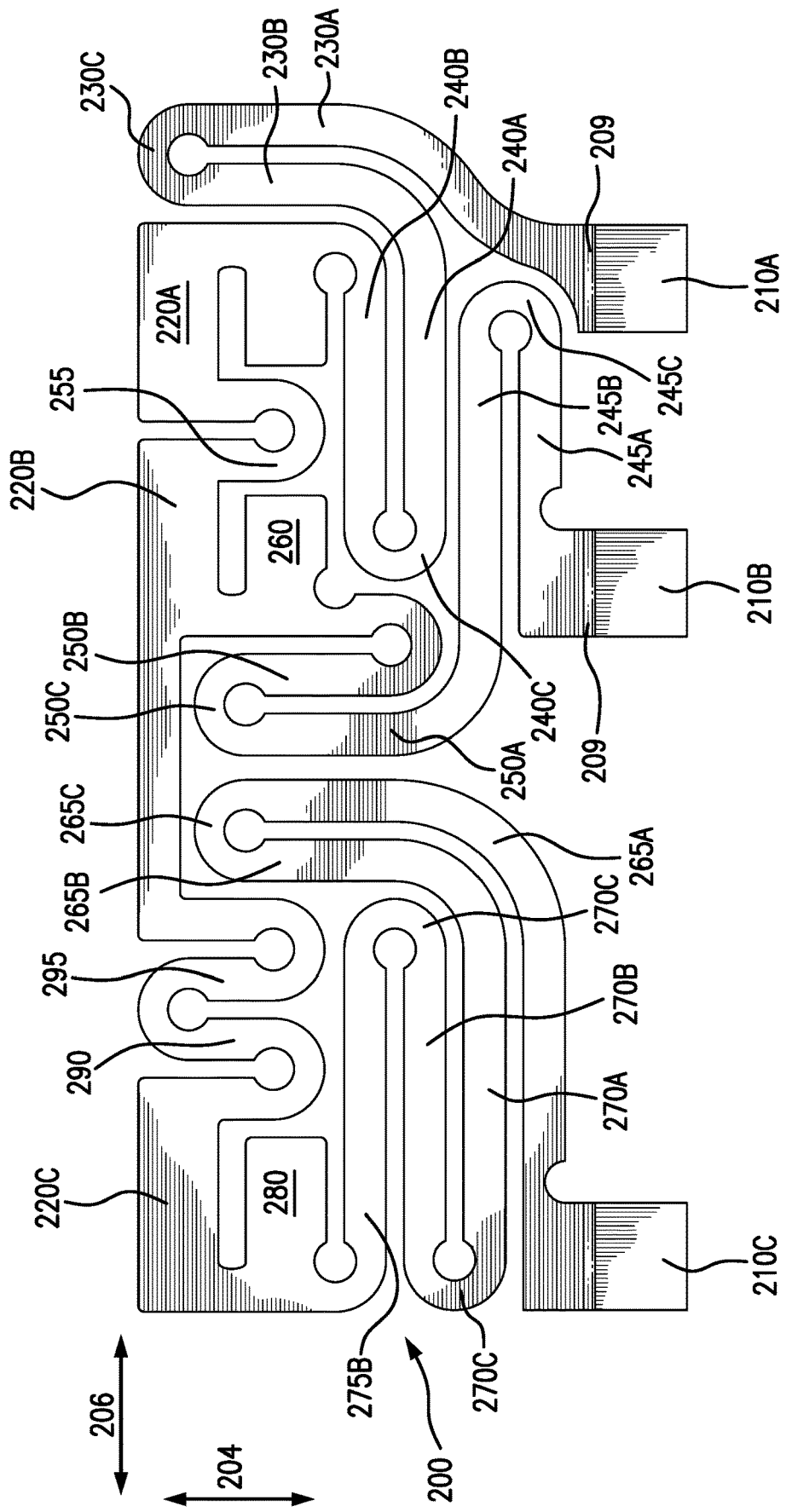
FIG. 5 discloses a top view of a second example of an interconnect member.
Figure 6:
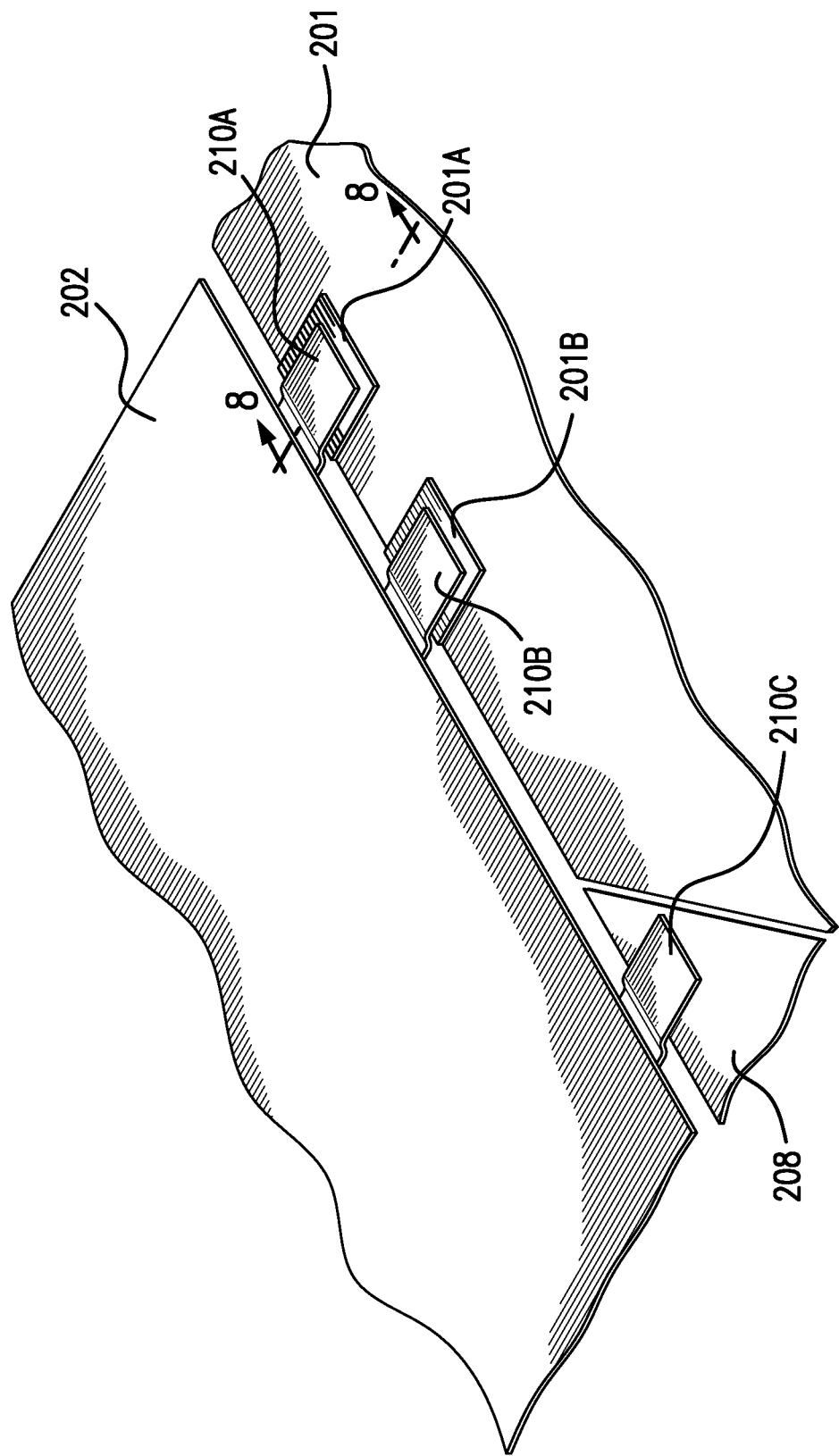
FIG. 6 discloses a top view of two series connected solar cells, connected through the second example of the interconnect member.
Figure 7:
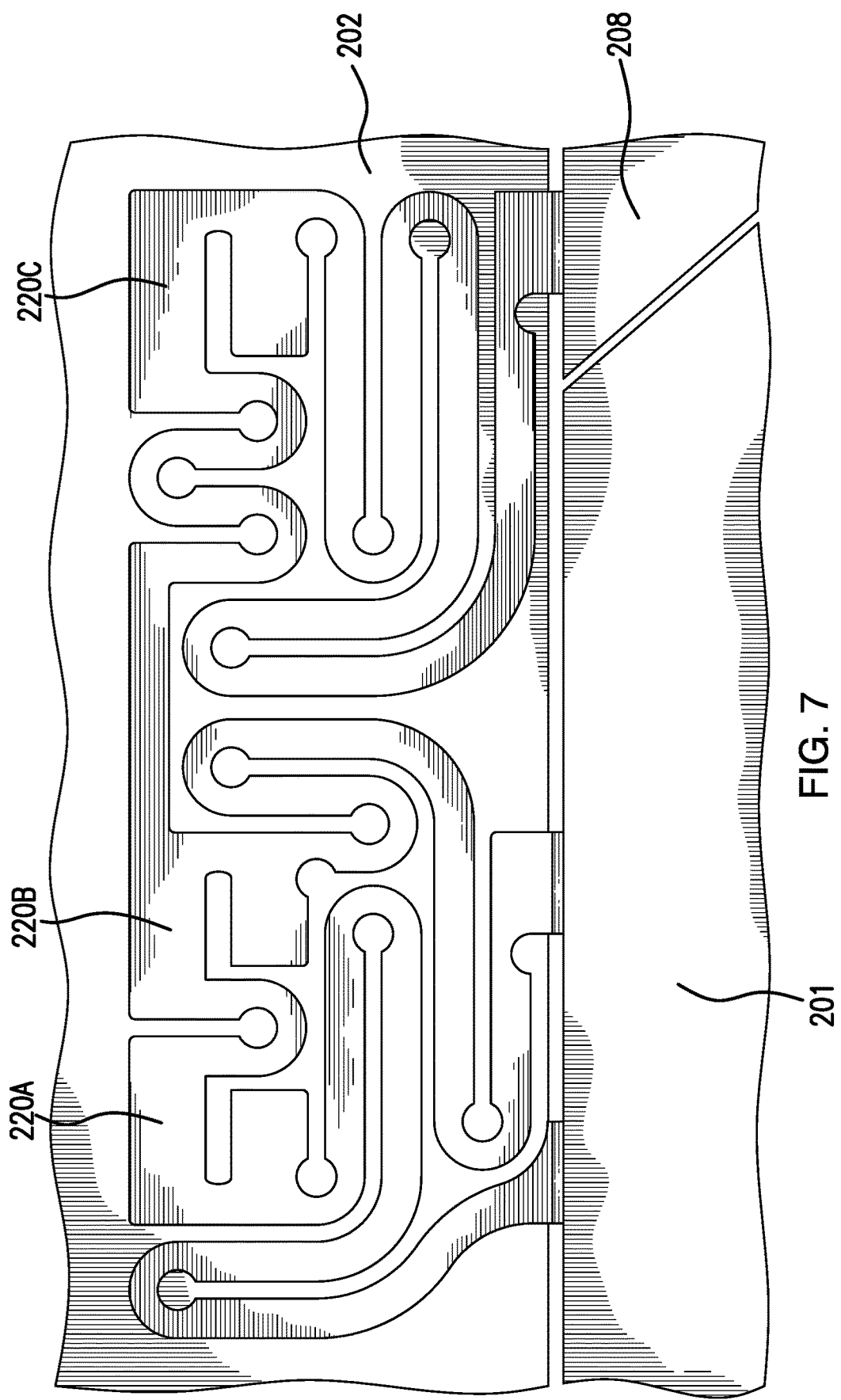
FIG. 7 discloses a bottom view of the assembly of solar cells shown in FIG. 6.
Figure 8:
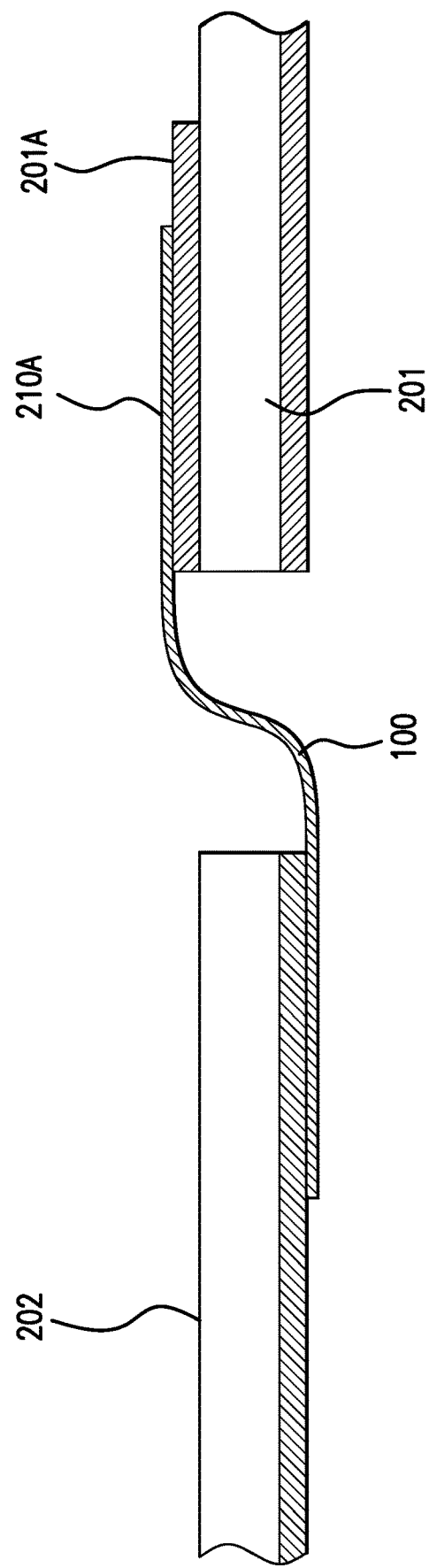
FIG. 8 discloses a side view of the same assembly.
Figure 9:
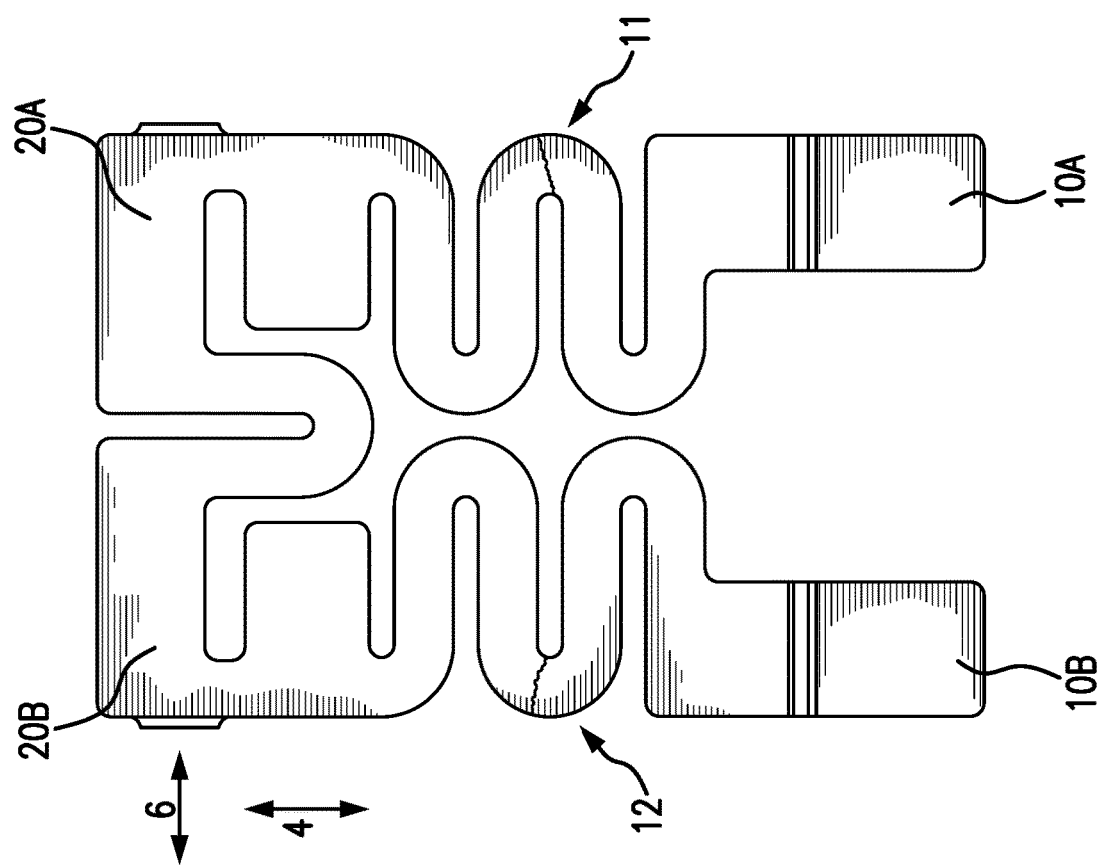
FIG. 9 discloses a prior art interconnect member.

FIG. 4 illustrates a bottom view of the interconnect member 100. The connecting portions 120A, 120B may be connected to a metallic layer on the bottom side of the second solar cell 102. The step portion 190 perpendicular to the plane is also illustrated. In some examples, the metallic layer may be a solid metallic foil having a thickness between 0.001 and 0.005 inches (between 0.0254 mm and 0.127 mm).

FIGS. 5-8 illustrate a second example of an interconnect member 200. As opposed to the first example, the second example has a "three toe" design including two connection pads 210A, 210B for connecting to a cathode of a first solar cell 201, and a connection pad 210C to connect to a cathode of a bypass diode.

At the opposite side of the interconnect member 200, there are three connecting portions 220A, 220B, 220C for connecting to an anode of a second solar cell. The first connection pad 210A is connected to first connecting portion 220A through a first serpentine path. The second connection pad 210B is connected to a second connecting portion 220B through a second serpentine path. And the bypass connection pad 210C is connected to the third connecting portion 220C through a third serpentine path.

In this example, each of the serpentine paths includes a loop or partial obround section including parallel portions along a first direction 204 and a curved portion in between. Each of the serpentine paths furthermore includes parallel portions along a second direction 206, perpendicular to the first direction 204, and a curved portion in between. The loops are provided substantially in the same plane. The metallic interconnect member 200 further includes a step portion 209 perpendicular to this plane. The step portion may be more clearly appreciated in FIG. 8.

The first serpentine path includes a longitudinal loop 230 with straight portions 230A, 230B and curved portion 230C, and a transverse loop 240 with portions 240A, 240B and 240C. The second serpentine path includes a transverse loop 245 with portions 245A and 245B extending along the second direction 206 and a curved portion 245C in between, and a longitudinal loop 250 including parallel portions 250A and 250B extending along the first direction 204 with a curved portion 250C in between.

In this example, the first and second serpentine paths are nested in between each other. In particular, the transverse loops 240 and 245 are arranged in between the longitudinal loops 230 and 250, and the transverse loop 240 is arranged longitudinally between the transverse loop 245 and the connection portions 220 on the second side. The third serpentine path is transversely offset from the first and second serpentine paths and includes a longitudinal loop 265 and one and a half transverse loops 270, 275.

Similarly to the first example, the interconnect member includes longitudinal loops 255, 290 and 295 in between the different connection portions, thereby introducing several gaps in between the connection portions. Similarly also to the first example, one or more or all of the curved portions may include a partial dumbbell shape as explained before.

The bypass diode may be arranged in a cropped corner 208 of the first solar cell 201. The bypass diode may have a substantially triangular shape with two acute angles. The bypass diodes may be silicon semiconductors, and may have a thickness of e.g. 140 microns. This may be seen particularly in FIG. 6 (showing a top view of a portion of a string of solar cells) and in FIG. 7 (showing a bottom view of the same).

In any of the examples disclosed herein, the interconnect members may be made of a silver-plated metal material.

Useful metals include, for example, molybdenum; a nickel-cobalt ferrous alloy material designed to be compatible with the thermal expansion characteristics of borosilicate glass such as that available under the trade designation KOVAR™ from Carpenter Technology Corporation; a nickel iron alloy material having a uniquely low coefficient of thermal expansion available under the trade designation Invar, FeNi36, or 64FeNi; or the like.

In any of the examples disclosed herein the connection pads may be welded to the cathode or top surface of the first solar cell and to a top surface or cathode of the bypass diode. Similarly, the connection portions on the opposite side of the interconnect member may be welded as well.

In any of the examples disclosed herein, cover glass may be bonded over the top surface of the solar cell, the bypass diode, and a first side of the interconnect member using an adhesive.

In any of the examples of the present disclosure, the solar cell assembly or glass interconnected cell (CIC) may be about 140 microns in thickness.

In some examples, a solar cell array comprising a supporting substrate including a molybdenum, KOVAR™ or Fe—Ni alloy having a CTE suitably matched to the CTE of the semiconductor and having a thickness between 0.001 and 0.005 inches (in between 0.0254 mm and 0.127 mm), and an array of solar cells mounted on the supporting substrate.

KOVAR™ is a trademark of CRS Holdings, Inc. of Wilmington, Del., and is a nickel-cobalt ferrous alloy designed to be compatible with the thermal expansion characteristics of borosilicate glass in order to allow adjacent disposition of the KOVAR™ material and the glass to ensure reliable mechanical stability over a range of temperatures.

In some examples, the semiconductor solar cells may have a thickness of less than 50 microns.

In some examples of the disclosure, a bypass diode may have a substantially triangular shape adapted to fit into a space left free by at least a portion of the cut corner. That is, the bypass diode can be fit into the space left free due to the absent corner, that is, the space that is formed between, for example, a linear contact member such as a linear bus bar, and the edge of the solar cell that is placed adjacent to the contact member.

Although described examples of the present disclosure utilizes a triple junction solar cell, i.e. a vertical stack of three subcells, various aspects and features of the present disclosure can apply to semiconductor devices with stacks with fewer or greater number of subcells, i.e. two junction cells, four junction cells, five, six, seven junction cells, etc. In the case of four or more junction cells, the use of more than one metamorphic grading interlayer may also be utilized.

In addition, although the disclosed embodiments are configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

While the solar cell described in the present disclosure have been illustrated and described as embodied in a conventional multijunction solar cell, it is not intended to be limited to the details shown, since it is also applicable to inverted metamorphic solar cells, and various modifications and structural changes may be made without departing in any way from the spirit of the present invention.

Thus, while the description of the semiconductor device described in the present disclosure has focused primarily on solar cells or photovoltaic devices, persons skilled in the art know that other optoelectronic devices, such as thermophotovoltaic (TPV) cells, photodetectors and light-emitting diodes (LEDS), are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

It is to be noted that the terms "front", "back", "top", "bottom", "over", "on", "under", and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although only a number of examples have been disclosed herein, other alternatives, modifications, uses and/or equivalents thereof are possible. Furthermore, all possible combinations of the described examples are also covered. Thus, the scope of the present disclosure should not be limited by particular examples, but should be determined only by a fair reading of the claims that follow. If reference signs related to drawings are placed in parentheses in a claim, they are solely for attempting to increase the intelligibility of the claim, and shall not be construed as limiting the scope of the claim.

The invention claimed is:

1. A string of solar cells comprising a first solar cell and a second solar cell connected in series, an interconnect member comprising a first and a second cathode pads to connect to a cathode of the first solar cell and a first and a second anode pads to connect to an anode of the second solar cell,
   a first serpentine path connecting the first cathode pad with the first anode pad,
   a second serpentine path connecting the second cathode pad with the second anode pad and comprising a longitudinal loop and a transverse loop,
   wherein the first serpentine path including a longitudinal loop having two parallel longitudinal portions and a curved portion in between, and a transverse loop having two parallel transverse portions and a curved portion in between,
   wherein the longitudinal loop of the first serpentine path is substantially perpendicular to the transverse loop of the first serpentine path, and
   wherein the transverse loop of the second serpentine path is longitudinally arranged between the transverse loop of the first serpentine path and the first and second cathode pads.

2. The string of solar cells according to claim 1, wherein the longitudinal loop of the first serpentine path is arranged on a right side of the cathode pads, and the longitudinal loop of the second serpentine path is arranged on a left side of the cathode pads.

3. The string of solar cells according to claim 2, further comprising a longitudinal loop between the first and the second cathode pads.

4. The string of solar cells according to claim 1, further comprising a third cathode pad to connect to a cathode of a bypass diode of the first solar cell, and a third anode pad to connect to an anode of the second solar cell, a third serpentine path connecting the third anode pad with the third cathode pad.

5. The string of solar cells according to claim 4, wherein the third serpentine path includes a longitudinal and a transverse loop.

6. The string of solar cells according to claim 5, wherein a distance between the first cathode and the second cathode pads is smaller than a distance between the second and the third cathode pads.

7. The string of solar cells according to claim 1, wherein the interconnect member comprises a silver-plated metal.

8. The string of solar cells according to claim 1 further comprising a bypass diode that is arranged in a cropped corner of the first solar cell.

9. The string of solar cells according to claim 1 further comprising a metallic layer on a bottom side of the second solar cell.

10. The string of solar cells according to claim 1 wherein the first and the second solar cells are III-V compound semiconductor multijunction solar cells.

11. The string of solar cells according to claim 1 wherein the first serpentine path connecting the first cathode pad with the first anode pad has the longitudinal loop first on the path and the transverse loop second on the path and wherein the second serpentine path connecting the second cathode pad with the second anode pad has the transverse loop first on the path and the longitudinal loop second on the path.

* * * * *